United States Patent [19]

Liu et al.

[11] Patent Number: 5,425,036
[45] Date of Patent: Jun. 13, 1995

[54] METHOD AND APPARATUS FOR DEBUGGING RECONFIGURABLE EMULATION SYSTEMS

[75] Inventors: Dick L. Liu, Saratoga; Jeong-Tyng Li, Cupertino; Thomas B. Huang; Kenneth S. K. Choi, both of San Jose, all of Calif.

[73] Assignee: Quickturn Design Systems, Inc., Mountain View, Calif.

[21] Appl. No.: 947,308

[22] Filed: Sep. 18, 1992

[51] Int. Cl.⁶ .......................................... G06F 15/60
[52] U.S. Cl. ..................... 371/23; 364/488; 364/489; 364/578; 371/22.2; 371/22.3
[58] Field of Search ............ 371/23, 22.2, 22.1, 371/22.3; 364/488, 489, 578, DIG. 1, DIG. 2, 232.2, 927.81, 579, 580, 16.2

[56] References Cited

U.S. PATENT DOCUMENTS

| | | | |
|---|---|---|---|
| 4,306,286 | 12/1981 | Cocke et al. | 364/200 |
| 4,488,354 | 12/1984 | Chan et al. | 29/830 |
| 4,583,169 | 4/1986 | Cooledge | 364/300 |
| 4,697,241 | 9/1987 | Lavi | 364/488 |
| 4,706,216 | 11/1987 | Carter | 365/94 |
| 4,744,084 | 5/1988 | Beck et al. | 371/23 |
| 4,758,745 | 7/1988 | Elgamal et al. | 307/465 |
| 4,758,985 | 7/1988 | Carter | 365/94 |
| 4,761,768 | 8/1988 | Turner et al. | 365/201 |
| 4,849,928 | 7/1989 | Hauck | 364/900 |
| 4,855,669 | 8/1989 | Mahoney | 324/73 R |
| 4,870,302 | 9/1989 | Freeman | 307/465 |
| 4,873,459 | 10/1989 | El Gamal et al. | 307/465 |
| 4,901,259 | 2/1990 | Watkins | 364/578 |
| 4,914,612 | 4/1990 | Beece et al. | 364/578 |
| 4,935,734 | 6/1990 | Austin | 340/825.83 |
| 4,937,827 | 6/1990 | Beck et al. | 371/23 |
| 4,949,341 | 8/1990 | Lopez et al. | 371/25.1 |
| 5,036,473 | 7/1991 | Butts et al. | 364/489 |
| 5,081,602 | 1/1992 | Glover | 364/578 |
| 5,109,353 | 4/1992 | Sample | 364/578 |
| 5,325,309 | 6/1994 | Halaviati et al. | 364/488 |

FOREIGN PATENT DOCUMENTS 58-205870  5/1982  Japan .

OTHER PUBLICATIONS

"A User Programmable Reconfigurable Logic Array," by Carter, et al.; IEEE Custom Integrated Circuits Conference, 1986.
"Benefits Of In-Circuit Re-Programmable Logic Devices," by Landry, Electro Conference, 1986.
"In-Circuit Emulation For ASIC-Based Designs," Wynn, VLSI Systems Design, pp. 38-45, Oct. 1986.
"Emulation of VLSI Devices Using LCAs," Schmitz

(List continued on next page.)

Primary Examiner—Emanuel T. Voeltz
Assistant Examiner—Kamini S. Shah
Attorney, Agent, or Firm—Lyon & Lyon

[57] ABSTRACT

An improved electronic design automation (EDA) system employs field programmable gate arrays (FPGAs) for emulating prototype circuit designs. A circuit netlist file is down-loaded to the FPGAs to configure the FPGAs to emulate a functional representation of the prototype circuit. To check whether the circuit netlist is implemented properly, the FPGAs are tested functionally by applying input vectors thereto and comparing the resulting output of the FPGAs to output vectors provided from prior simulation. If the FPGAs fail such vector comparison, the FPGAs are debugged by inserting "read-back" trigger instructions in the input vectors, preferably corresponding to fail points in the applied vector stream. Modifying the input vectors with such read-back signals causes the internal states of latches and flip-flops in each FPGA to be captured when functional testing is repeated. Such internal state information is useful for debugging the FPGAs, and particularly convenient because no recompilation of the circuit netlist is required. A similar approach which also uses the read-back feature of FPGAs is employed to debug FPGAs coupled to a target system which appears to fail during emulation runs.

11 Claims, 8 Drawing Sheets

OTHER PUBLICATIONS

VLSI Systems Design, pp. 54–62, May 20, 1987.

Bradly K. Fawcett, "Taking Advantage of Reconfigurable Logic," (1989) Programmable Logic Guide, pp. 17–24.

Bill Harding, "New Design Tools Revive In–Circuit Design Verification," Computer Design, Feb. 1, 1989, pp. 28, 30, 32.

Tom Manuel, et al., "Advanced Tools Tackle More Complex Chips In The New Generation of PLDs," Electronics Design and Test, May 12, 1988, pp. 111–113.

Bob Milne, "Prototype PC Board Emulates ASICs," Electronic Design, Nov. 23, 1988, pp. 149–151.

Gregory F. Pfister, "The Yorktown Simulation Engine: Introduction," 19th Design Automation Conference, (1982) IEEE, pp. 51–73.

David Shear, "Tools Help You Retain The Advantages of Using Breadboards In Gate–Array Design," Technology Update, EDN, Mar. 18, 1987, pp. 81–88.

Stephen Walters, "Computer–Aided Prototyping for ASIC–Based Systems," IEEE Design and Test of Computers, Jun. 1991, pp. 4–10.

Pardner Wynn, "Designing With Logic Cell Arrays," Electro/87 and Mini/Micro Northeast Conference Record, (1987), pp. 1–9.

Xilinx, Inc., "The Programmable Gate Array Data Book," (1988), pp. 1–2, 8–5.

Xilinx, Inc., "The Programmable Gate Array Design Handbook," First Edition, (1986) pp. 1-1–4-33, A–1–A9.

METHOD AND APPARATUS FOR DEBUGGING RECONFIGURABLE EMULATION SYSTEMS

BACKGROUND OF THE INVENTION

1. Field of the Invention

This invention relates to software programs and related hardware for electronic design automation (EDA), and in particular to such EDA "tools" for emulating logic circuits.

2. Description of the Background Art

Various EDA tools are known for designing integrated circuits. In a typical EDA tool suite, Computer Aided Engineering and Design (CAE/CAD) software are configured in various engineering workstations to provide design engineers with automated or semi-automated tools for defining and verifying circuits, typically either in the form of discrete integrated circuits (chips) or subsystem printed circuit boards.

Circuit definition is generally accomplished with schematic-capture tools, which allow the designer to enter symbolic representations of components and interconnections for a particular circuit. More recently, circuit definition has also been accomplished with synthesis tools, which allow the designer to describe textually the function of a particular circuit design through various hardware description languages (HDL).

After a particular circuit is defined, the design engineer then verifies the accuracy of the circuit. The circuit verification step is typically accomplished through simulation, which serves to test the correctness of the circuit's functional behavior in response to various applied stimuli, such as digital input signals or test vector patterns. Thus, if the design engineer determines during simulation that the circuit design is defined incorrectly, then the circuit may be re-defined, typically through iterative modifications of either the circuit schematic or the HDL file.

Typically, once the circuit definition and verification steps are completed, the CAE tool portion of the EDA tool suite then generates a circuit description file, or "netlist." The netlist contains a description of the circuit's components and electrical interconnections, and this file is used by the CAD tool portion of the EDA tool suite for performing automatic chip or board-level lay-out. Lay-out information is then converted by the CAD tool into a physical description or pattern generation file, typically referred to as a "PG tape," which is used for photomask manufacturing.

The chip manufacturing process is initiated essentially at the photomask manufacturing step since the circuit design is verified and committed by the design engineer at that time to proceed to wafer fabrication, where silicon chips embodying the verified circuit are made. The manufacturing process includes semiconductor wafer processing, device assembly and testing, and thus can be expensive and time-consuming. An analogous process flow is followed conventionally for circuit-board manufacturing.

If the manufactured prototype chip or board (containing chips) is somehow non-functional and requires redesign, then additional cost and delay are incurred. Thus, it is desirable to ensure that the netlist file, which is used to manufacture a particular circuit, correctly represents the circuit design intended by the design engineer.

Despite the circuit verification or simulation steps typically employed to test for circuit correctness, however, the prototype circuit may nonetheless be non-functional because of various failure modes, such as incorrect simulation modeling, inadequate simulation vector testing and improper system interfacing.

Thus, to verify further the correctness of the circuit netlist file (i.e., prior to committing the circuit design to manufacturing,) an approach known as circuit emulation is sometimes used in conjunction with existing EDA tools. Emulation aims to reduce or eliminate delays and costs associated with re-designing and re-manufacturing non-functional circuit prototypes.

In general, emulators function similarly to simulators in that both emulator and simulator tools imitate the functional behavior of a designed circuit, typically for test or debug purposes. However, in comparison to simulators, which merely apply user-specified input test vector patterns as stimuli to simulation models of a given circuit, emulators actually interface a functional, emulated circuit to its intended target system. In this way, the emulated circuit is electrically coupled within its design environment, thereby enabling real-time validation of the circuit under actual operating conditions, where the stimuli applied to the prototype circuit may be substantially more comprehensive. Thus, emulators are designed to verify the functional correctness of circuits more accurately by avoiding failure modes associated with inadequate simulation vector testing and improper system interfacing of prototype circuit designs.

In addition, since emulators are configured to provide an actual implementation to represent functionally a given emulated circuit design (i.e., through either conventional "bread-boarded" discrete logic or various reconfigurable logic devices, onto which the netlists of circuit designs are down-loaded,) then failure modes associated with incorrect simulation modeling are largely eliminated.

Presently, emulation tools operate in conjunction with conventional EDA tools to enable automatic down-loading of netlists to various reconfigurable logic devices, such as field programmable gate arrays (FPGAs). This general EDA approach of combining reconfigurable logic devices with emulation technology is particularly appealing since it facilitates iterative testing and debugging of circuit designs, without the inconvenience and complexity of rewiring bread-boards.

As circuit designs grow in functional complexity and gate count, however, the usefulness of known EDA tools employing reconfigurable emulation techniques becomes more limited. For instance, with larger circuits, EDA CAD tools increasingly encounter routing congestion, typically due to larger netlists requiring multiple re-compilations in order to achieve routing of all signal subnets. Also, even when larger circuits are eventually implemented for emulation (i.e., on bread-boards or FPGAs,) it may still be difficult or impossible to access various internal nodes or states within the emulated circuits for test or debug purposes.

Therefore, it would be desirable to provide EDA tools, which use reconfigurable logic devices in emulation applications, whereupon the foregoing type of congestion-related limitations are avoided, such that prototype circuit debugging is thereby facilitated.

SUMMARY OF THE INVENTION

The invention resides in using a "read-back" function provided in certain reconfigurable logic devices, by capturing internal state information from such devices, thereby enabling debug without device recompilation.

In an emulation embodiment, an improved EDA system provides a circuit netlist file for down-loading a circuit definition to FPGAs, thereby implementing a representation of a prototype circuit. The EDA system also provides thereto input and output vectors, which were provided previously for simulating circuit functionality. The input vectors are applied as stimuli to the FPGAs, thereby enabling functional testing of the circuit.

If the output signals resulting from the functional testing of the FPGAs are detected to differ from, or in some cases, be identical to, the output vectors provided previously, then the FPGAs are analyzed logically to debug such detected condition, particularly to determine why certain signals or events apparently failed to behave as expected. In this regard, the read-back feature is used during functional re-testing of the circuit by modifying the input vectors applied to the FPGAs to include read-back trigger vectors at selected failure points in the input vector stream for capturing internal state information from certain state machines within the FPGAs.

In a related embodiment in which the FPGAs are already configured to represent the emulation functionality of the prototype circuit, the read-back feature similarly is used to debug a target system coupled to the FPGAs by capturing internal state information from such FPGAs when the target system, and thus perhaps the FPGAs coupled thereto, fail to behave as expected.

DESCRIPTION OF THE PREFERRED EMBODIMENTS

Figure 1:
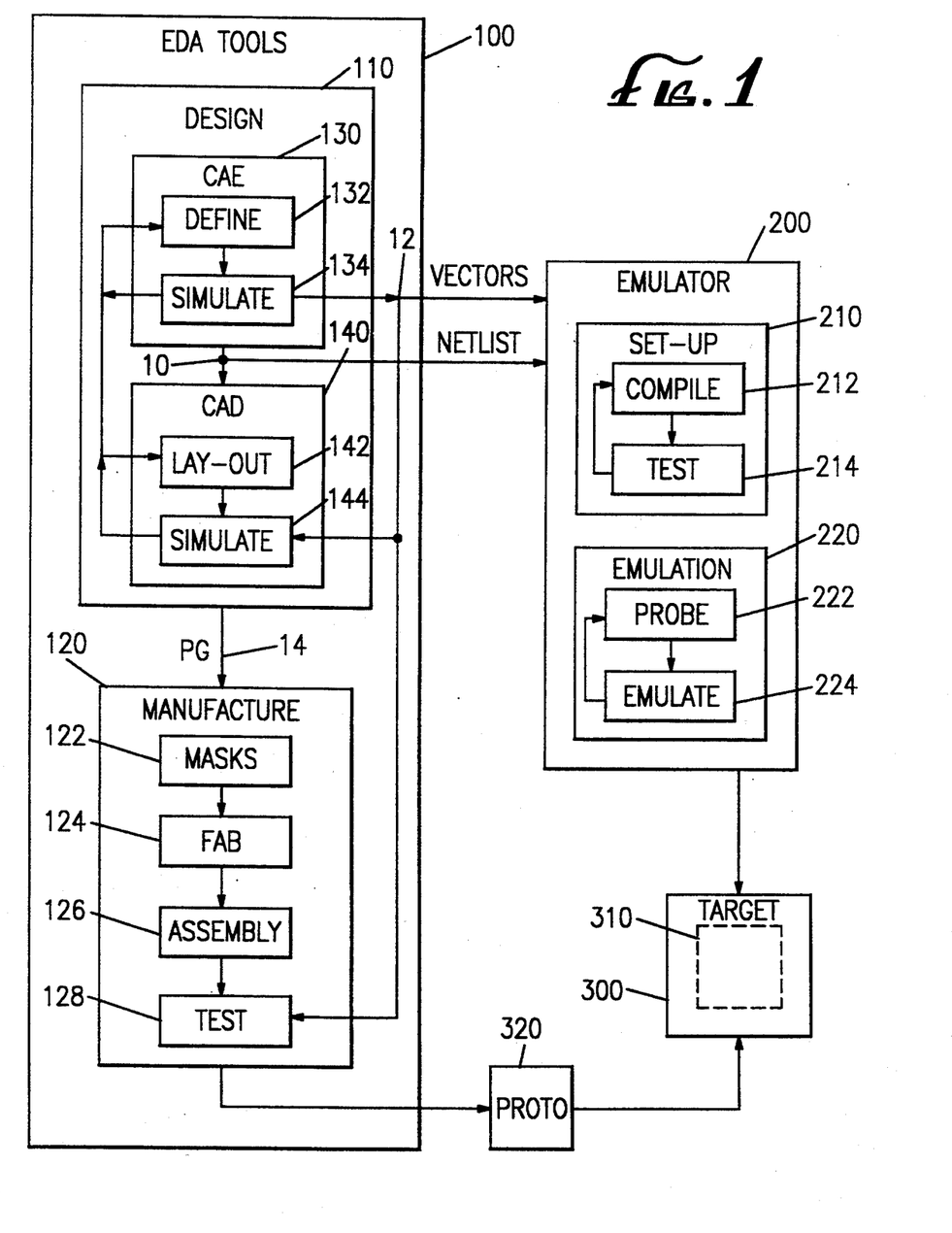
FIG. 1 is a block diagram showing the general design methodology employed by improved EDA system 100 and emulator system 200 for producing a prototype circuit 320 to be used in target system 300.

FIG. 1 shows a diagrammatic view of the general design methodology employed by electronic design automation (EDA) system 100 and related emulator system 200 for producing a prototype circuit or subsystem circuit board 320 to be used in target system 300. EDA system 100 includes integrated software and hardware tools for providing a design capability 110 to define and verify circuits and a manufacture capability 120 to make such circuits, such as prototype circuit 320 for use in target system 300, typically a computer or related subsystem board.

Design capability 110 includes a computer-aided engineering (CAE) tool 130 and a related computer-aided design (CAD) tool 140. CAE tool 130 facilitates the accomplishment of circuit definition 132 and circuit verification or simulation 134 by EDA users or design engineers, typically through the use of schematic capture or design synthesis tools. Once a circuit is defined and verified, CAE tool 130 provides a circuit netlist file 10, which describes the components and interconnections of the circuit, and input and output vectors 12, which were used during simulation 134 of the circuit.

CAD tool 140 receives netlist 10 from CAE tool 130 to perform automatic circuit place-and-route or lay-out at step 142. Again, circuit simulation 144 verifies circuit functionality, typically using the same input vectors 12, this time, however, accounting for lay-out related design parameters, such as signal delays arising from interconnect capacitances and resistances. Sometimes circuit verifications or simulations 134, 144 indicate to the design engineer that circuit redesign or redefinition is appropriate.

However, if the design engineer is satisfied that design capability 110 adequately verifies the functionality of the circuit design, then the circuit design is committed to proceed to manufacturing, and a pattern generation (PG) tape or file 14 is provided to manufacture capability 120. In the case of chip manufacturing, PG tape 14 is used to make photomask sets 122 for the circuit design. Masks 122 are used for fabricating semiconductor wafers 124 embodying the circuit design. Wafers 124 are processed through package assembly 126 and device test 128 to produce prototype circuit 320. A similar process is followed conventionally for making and testing printed circuit boards (PCBs). Because the foregoing manufacturing processes are generally costly and time-consuming, it is important to ensure the correctness of the circuit design defined by netlist file 10 (and PG tape 14).

To improve the likelihood that netlist file 10 (and PG tape 14) are correct, emulator system 200 is thus coupled to EDA system 100 and target system 300. Circuit netlist file 10 and associated input and output vectors 12 are provided by CAE tool 130 to set-up step 220 of emulator system 200. Emulator system 200 allows an emulation representation of the circuit design to be connected physically to corresponding signal pins in intended electrical socket 310 of target system 300 for real-time, functional operation therein.

In accordance with the present invention, emulator system 200 includes "read-back"-type reconfigurable logic devices which are configured to represent the functionality of an emulated circuit. At set-up step 212, such reconfigurable logic devices are configured at compile step 212 and functionally tested at test step 214. Following set-up step 210, at emulation step 220, such reconfigurable logic devices are coupled through probe interfaces to target 300 at probe step 222 and actually operate in emulation mode (in conjunction with an embedded functional test mode, as discussed later) at emulate step 224.

Figure 2:
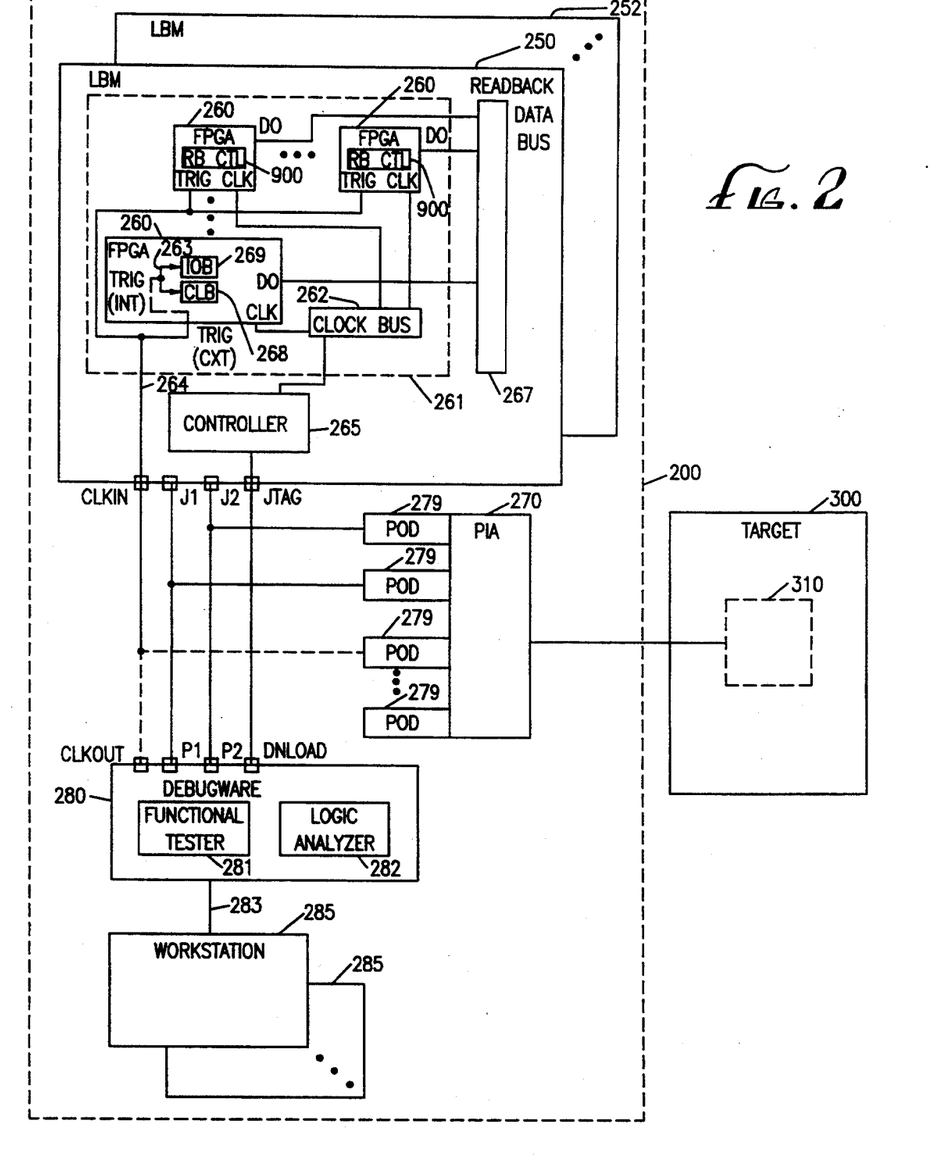
FIG. 2 is a block diagram of an implementation of the present invention, showing emulator system 200 coupled to target system 300.

FIG. 2 shows an implementation of the present invention, including emulator system 200 coupled to target system 300. Emulator system includes logic block modules (LBMs) 250 containing reconfigurable logic devices or field programmable gate arrays (FPGAs) 260. LBMs 250 couple to target system 300 through pods 279 and wire-wrap connector or pod interface adaptor (PIA) 270. Preferably, pods 279 are designated for interfacing solely either clock or data signals.

Also, LBMs 250 couple to debugger or "debugware" unit 280, which communicates over conventional digital network links 283, such as ethernet, to engineering workstations 285. Debugware 280 is a multi-purpose test and debug instrument or processor including logic analyzer 282 and functional tester 281. Debugware 280 may operate in either logic analyzer/emulation or functional test mode.

When operating in logic analyzer mode, debugware 280 may generate a trigger-out or read-back signal which is controlled by a user to trigger asynchronously a read-back function, as discussed later. Debugware 280 includes a port connector, which complies with the "JTAG" standard (known as IEEE Std. 1149.1 Standard Test Access Port and Boundary Scan Architecture), and is connected to LBMs 250 for retrieving read-back data. Preferably, debugware 280 includes a sufficient number of probe ports and memory capacity for monitoring up to 64K execution cycles of primary input and output signals and nodes for a given prototype circuit 320.

When operating in functional test mode, debugware 280 converts logic analyzer trace data to applied stimuli. Additionally, in this mode, debugware 280 may pause at user-specified instants to initiate LBM 250 internal node read-back, or restore LBM 250 to a read-back triggered state. Preferably, debugware 280 includes a stimulus generator for enabling batch, single-step or break-point operational modes, and a strobe signal for synchronously triggering read-back, e.g., where read-back trigger is synchronous to system clocking.

Preferably, Logic Cell Arrays (LCAs) or FPGAs 260 from the "XC4000" FPGA family, which is available commercially from Xilinx, Inc. in San Jose, Calif., or other similar reconfigurable logic circuits or FPGAs, may be used equivalently to FPGAs 260 to the extent that such FPGAs feature a "read-back" or operationally-similar function for capturing and generating internal states of state machines, such as flip-flops and latches within such FPGAs, upon the application of a read-back type trigger signal thereto, as specified, for example, in the Xilinx XC4000 Databook (1991). The read-back function permits a "snapshot" of the contents of all flip-flops to be taken at the start of each read-back call, for example, when a READBACK CAPTURE ENABLE option is selected.

Thus, in accordance with the present invention, an improved emulation debugging method and system advantageously make use of such FPGA read-back capability, instead of using incrementally-compiled probes, for observing circuit internal nodes and states.

In the present implementation, FPGAs 260 are assembled in a matrix arrangement 261 on each LBM 250. Each FPGA 260 includes at least one clocked state device 268, 269 and has a common external trigger pin or line, TRIG (EXT) 264, which is coupled to TRIG (EXT) pins 264 of all other FPGAs 260, on LBMs 250. Moreover, within each FPGA 260, a common internal trigger pin or line, TRIG (INT) 263 is coupled to all state devices 268, 269 included therein. Because TRIG (EXT) 264 and TRIG (INT) 263 are electrically connected, a single pulse applied to such electrical connection would cause a read-back trigger of all state devices 268, 269 which are connected thereto.

Also, each FPGA 260 includes read-back clock pin (CLK), which, along with the CLK pin of all other FPGAs 260, are included separately in clock bus 261. Each FPGA 260 includes a Data Out pin (DO), which is coupled separately to read-back data bus 267 included on each LBM 250, such that each state device 268, 269 therein has its individual read-back clock and data lines.

Figure 3:
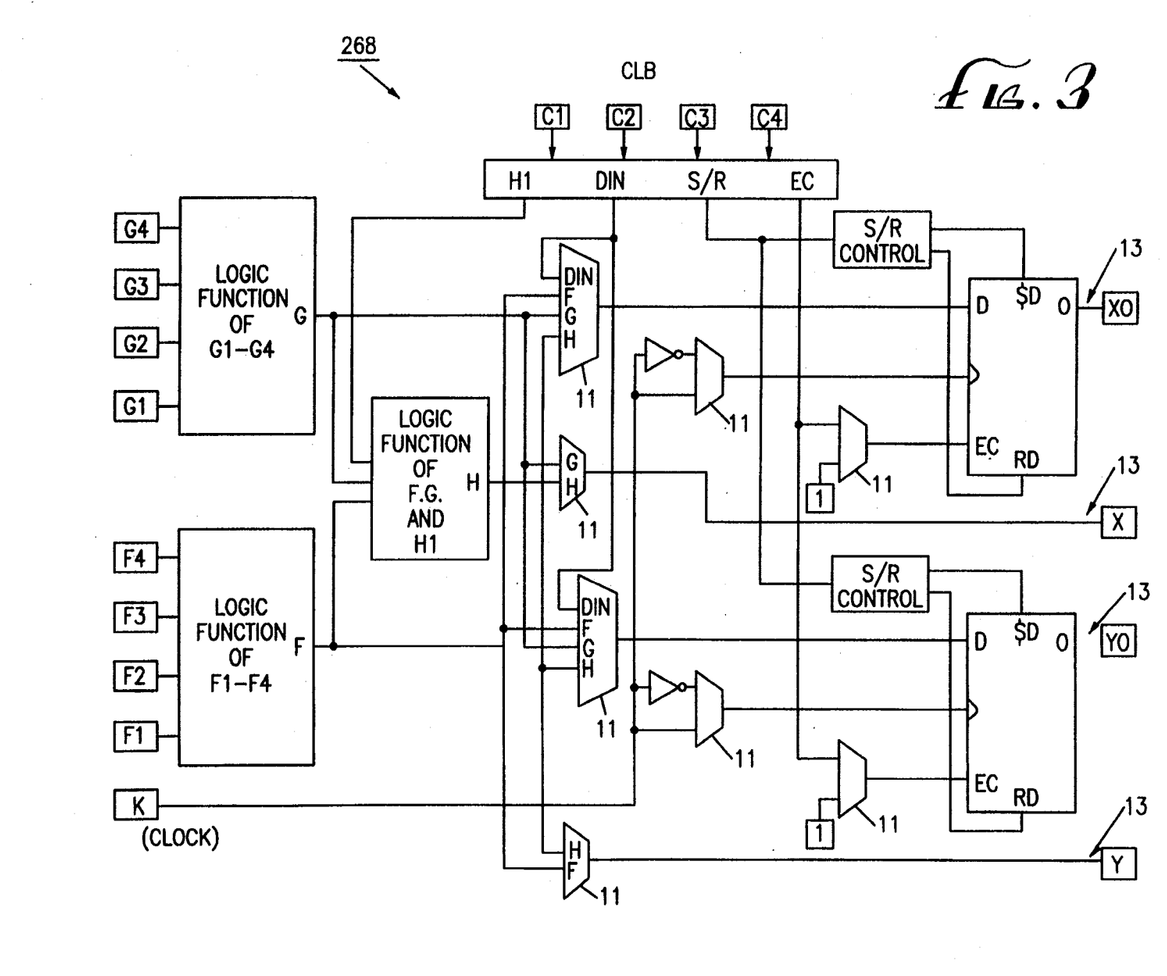
FIG. 3 is a block diagram of Xilinx FPGA CLB module 268.
Figure 4:
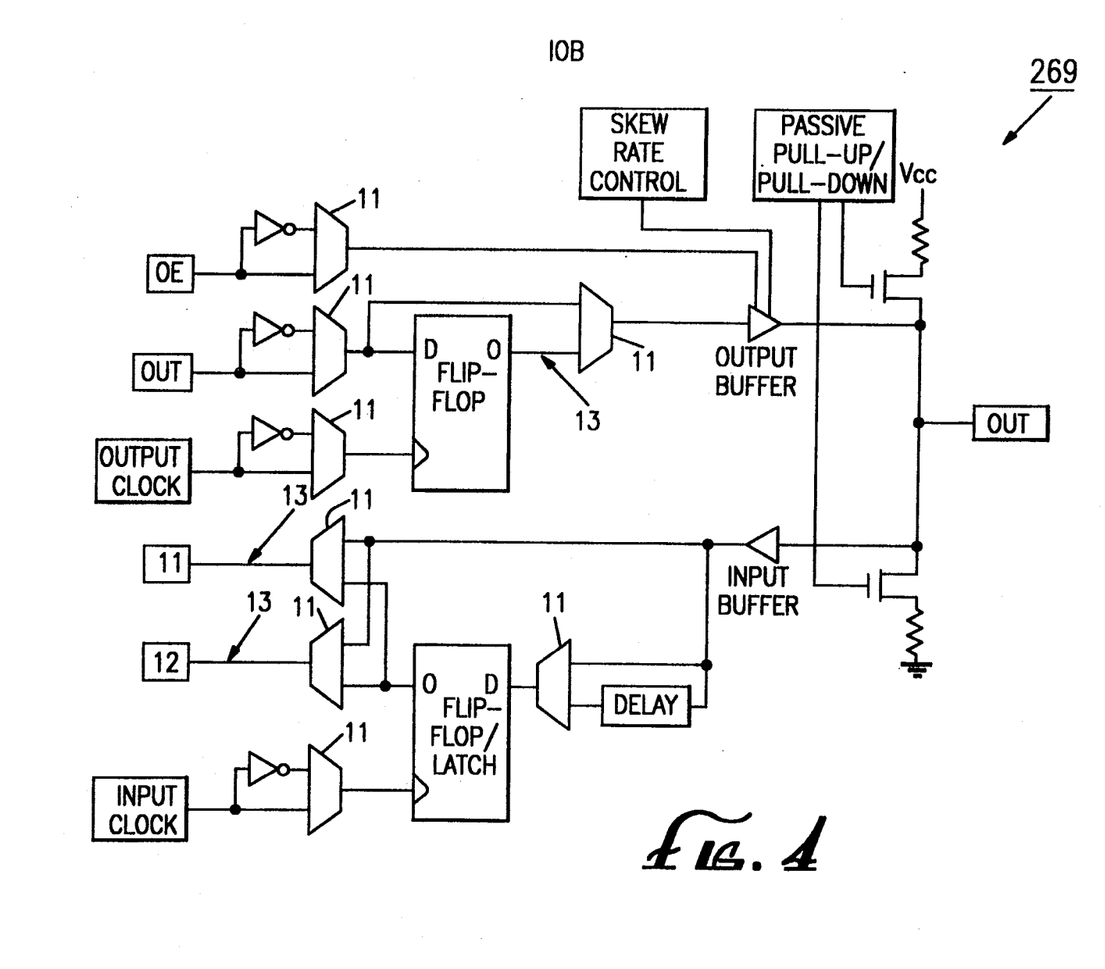
FIG. 4 is a block diagram of Xilinx FPGA IOB module 269.

Preferably, state devices 268, 269 are provided conventionally, for example, by Xilinx LCAs as Configurable Logic Block (CLB) 268 and as Input/Output Block (IOB) 269, as partially detailed respectively in FIGS. 3 and 4, where configurable multiplexers 11 and designated read-out points 13 are shown associated with capturing read-back data from various flip-flops and latches.

Additionally, JTAG or bus controller 265 included on LBM 250 is coupled to clock bus 261 and to a JTAG port on each LBM 250 such that read-back clock and data lines are accessible from the JTAG port. An input clock pin or port (CLKIN) on each LBM 250 is coupled to each TRIG (EXT) pin 264 on each FPGA 260.

Moreover, J1 and J2 pins or ports on the boundary of each LBM 250 are coupled respectively to P1 and P2 pins or ports on debugware 280, and to interface pods 279, as well. CLKIN port on each LBM 250 may couple to either pod 279 or output clock port (CLKOUT) on debugware 280, as selected by a system user. Download port (DNLOAD) on debugware 280 couples to JTAG port on each LBM 250. In this way, the read-back trigger signal may be included in the LBM 250 connector port.

With respect to using Xilinx LCAs or FPGAs 260, certain internal nodes are designated as accessible at read-out nodes 13 for read-back data capture. Read-out nodes 13 include X and Y output signal pins of function generators in CLB 268, and XQ and YQ output signal pins of CLB 268 flip-flops and latches. In this way, during netlist 10 compilation, prototype circuit 320 flip-flops, for example, are mapped automatically to CLB 230 flip-flops. Note that to the extent that Xilinx FPGA application programming software does not guarantee the availability of latch or flip-flop outputs as a read-back signal net for read-out, such outputs may be mapped forcibly, if necessary, to CLB function generator outputs.

Figure 5:
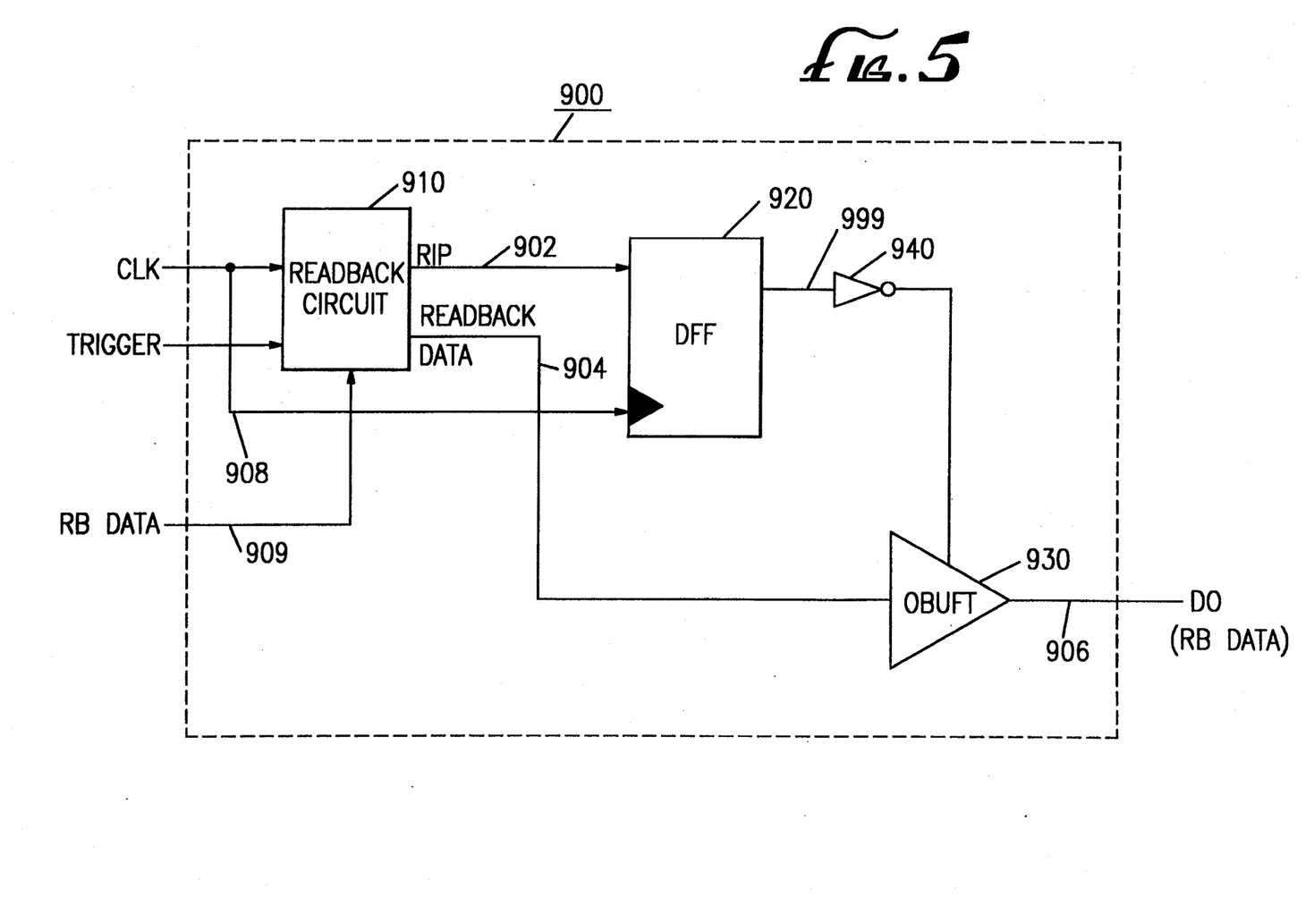
FIG. 5 is a block diagram of readback control RBCTL 900 configured in FPGAs 260 to enable multiple readback data output 906 from multiple FPGAs 260.

Preferably, FPGAs 260 include readback control circuit 900, coupled to CLK, TRIG, and various read-back data output or DO signals 906, for enabling read-back data output from multiple FPGAs 260.

When operating, emulator system 200 operates to permit testing of reconfigurable emulation circuits or FPGAs 260. In accordance with the present invention, emulator system 200 tests or debug such reconfigurable emulation circuits generally according to the following steps:

(1) Configuring Step:

A reconfigurable circuit or LBM 250, preferably including at least one Xilinx XC4000-class FPGA 260, is configured to represent the functionality of an emulated prototype circuit or circuit subsystem board 320. This step involves down-loading from an EDA CAE tool 130 a netlist file 10 of the emulated circuit 320. Netlist 10 is then compiled to program or configure reconfigurable circuit 260.

Initially, configuring LBMs 250 to a predefined state includes loading design-specific programming data based on netlist 10 into each FPGA 250 or state device 268, 269, preferably by setting initial values into each storage element within each state device 268, 269. Flip-flops, in particular, may be initialized either by:
  (a) converting the prototype design into a so-called "scan" device, wherein during initial design compilation, each flip-flop is implemented as a scan flip-flop, and when LBMs 250 are later down-loaded, such scan flip-flops are initialized using conventional scan chain approach, or
  (b) recompiling incrementally using global set/reset lines, such that flip-flops may be initialized to logical high ("1") by tying asynchronous set input lines through S/R control logic interfaces to the global set/reset line. In this configuration, the global set/reset line may be activated after down-loading the recompiled circuit design, thereby initializing flip-flop states, and global set/reset lines remain effectively transparent during emulation because such lines are not part of the original circuit 320 design.

(2) Operating Step:

The configured reconfigurable circuit (CRC) 250, 260 is operated by applying thereto electrical stimuli, such as digital input vector signals 12A. The stimuli may include data and clock signals which are applied to CRC 250, 260 from target system 300 or debugware 280 through data and clock signal lines, preferably passing through interface pods 279. This stimuli application causes CRC 250, 260 to function logically and generate actual response or output signals 211.

(3) Detecting Step:

A test or detection 216, 235 is made to determine when actual response 211 differs, for example, in digital or analog temporal or level response, from expected actual response or simulated signals 12B. Detection may occur either by a user visually recognizing functional anomalies when target system 300 fails to operate according to user-defined expected response 12B, or by debugware 280 or conventional processor recognizing behavioral differences from automatically comparing actual response 211 with digital output vector signals 12B, which represent expected response.

In some applications, detection step 216, 235 may include monitoring or comparing actual response 211 to determine when at least some pre-defined portion of actual response 211 identically matches or is substantially the same, for example, in digital or analog temporal or level response, as expected response 12B. In these applications, automatic read-back of internal state information at pre-defined trigger execution points would be facilitated, for example, when pre-defined output signals associated with suspected failure conditions are detected.

(4) Modification and Re-Operation Step:

If actual response 211 is detected to differ from, or in some cases, be the same as, expected response 12B, the stimuli applied to CRC 250, 260 is modified to include a read-back or trigger signal. The read-back signal may be a modified clock signal which couples to CRC 250, 260. The read-back signal triggers CRC 250, 260 to generate a modified response. The modified response may include current internal state information, such as latch and flip-flop states, as well as stored values from non-state devices. The captured internal state and non-state information is shifted-out serially from CRC 250, 260 to at least one external port coupled thereto. This internal information is provided to enable CRC 250, 260 logic analysis.

Logic analysis includes debugging CRC 250, 260 functionality using a graphical waveform display or generator, preferably using logic analyzer 282 which displays the modified response and reconfiguring the reconfigurable circuit to represent functionally a modified emulated circuit. Also, the read-back signal triggers CRC 250, 260 at a predetermined trigger point within the modified stimuli to cause CRC 250, 260 to generate the modified response at a failure detection instant or predefined time window during operation of CRC 250, 260. For a read-back trigger to occur, CRC 250, 260 operate at a modified clock rate, preferably approximately one megahertz or less.

After the stimuli applied to CRC 250, 260 is modified, CRC 250, 260 is re-operated by applying the modified stimuli thereto. This causes the CRC to generate a modified response. The modified response is provided to debugware system 280 coupled to CRC 250, 260.

The reconfiguring step includes down-loading into the reconfigured reconfigurable circuit (RCC) 250, 260 a modified netlist file 10 of the modified emulated circuit for re-compilation into RCC 250, 260. The modified netlist file 10 includes binary information for setting at least one initial state of at least one state machine included in RCC 250, 260. The state machines may be D-type flip-flops having set and reset modes (i.e., DFFRS).

FIG. 5 shows a block diagram of RBCTL circuit 900 configured in FPGA 260, for enabling readback data output from multiple FPGAs 260. RBCTL 900 includes readback circuit 910, which is conventionally provided in XILINX-type FPGAs 260 for generating readback data signal 904 in response to applied CLK and TRIG signals. Preferably, readback circuit 910 receives readback data signals 909, containing internal state information, from the same FPGA 260.

Readback circuit 910 also generates "readback-in-progress" signal 902 (RIP), according to conventional XILINX-type FPGAs 260. Preferably, RIP signal 902 and CLK signal 908 are received by D-type flip-flop 920 which then produces control signal 999, which is inverted through inverter 940 and applied to tri-state output buffer 930 (OBUFT).

OBUFT 930 is enabled by inverted signal 999 to produce readback data output signal 906 from readback data signal 904 from circuit 910, preferably according to time-multiplexed arrangement, such that readback data output or DO signal 906 may correspond in time according to corresponding readback clock signal CLK for each particular FPGA 260. In this way, readback data output signals from different FPGAs 260 may pass separately and serially, during different times, through a single data line or DO 906, as a serial readback data bus 267. Hence, RBCTL 900 facilitates time-selectable readback data output from multiple FPGAs 260.

Figure 6:
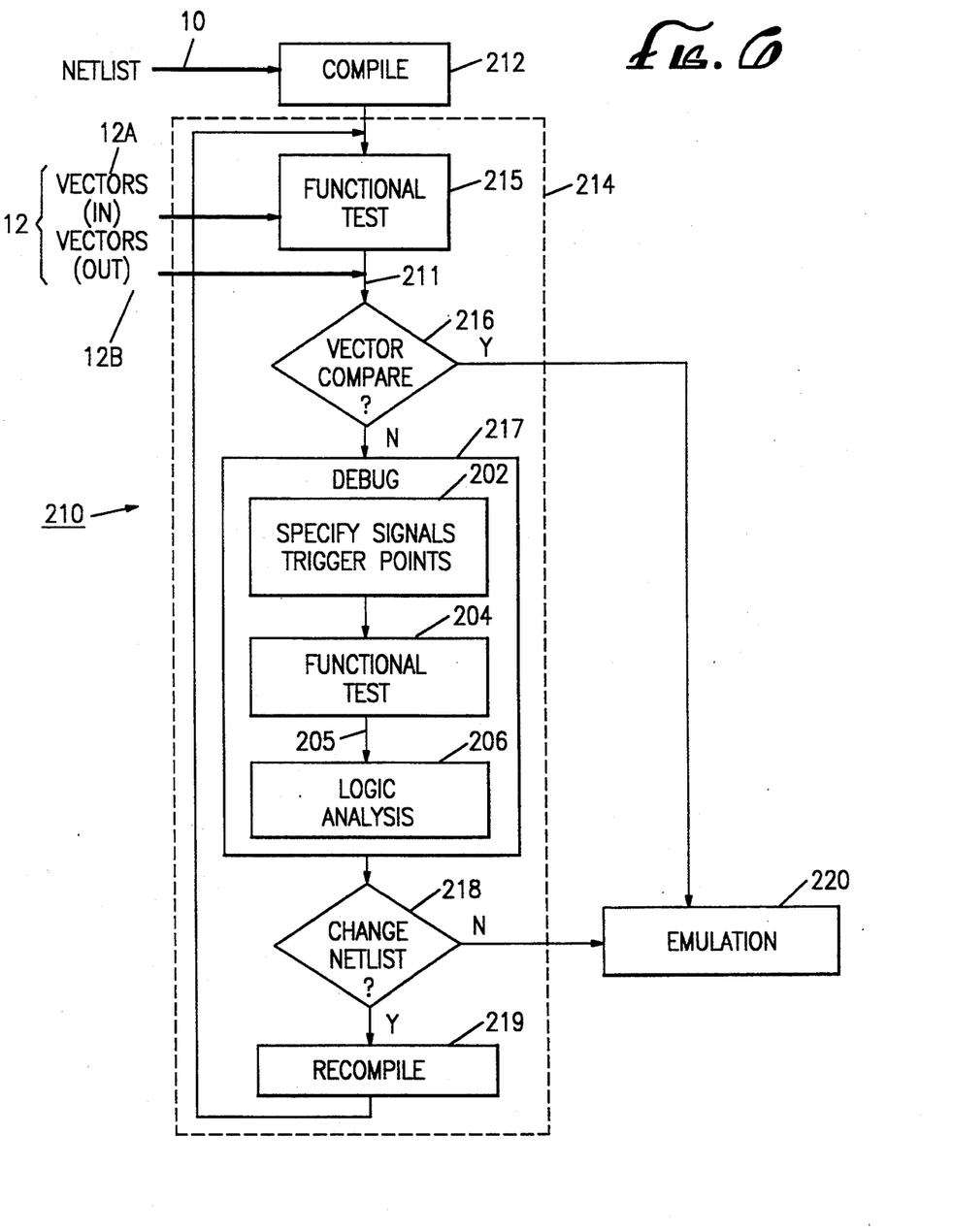
FIG. 6 is a flow chart of a method embodying the present invention in functional test mode.

FIG. 6 shows a flow chart of a method embodying the present invention, wherein debugware 280 is set and armed to operate in functional test mode, using functional tester 281, at set-up step 210. Initially, circuit netlist file 10 is received from EDA CAE tool 100. Circuit netlist file 10 includes a functional representation of an emulated prototype circuit, and circuit netlist file 10 is compiled at step 212 for down-loading to FPGAs 260. This down-loading step configures FPGAs 260 by programming state devices (IOB, CLB) 269, 268 with appropriate bit files to implement logically the emulated circuit.

At functional test step 215, the functionality of configured FPGAs 260 are tested operationally by applying digital input vectors 12A provided by EDA tool 100 as electrical signal stimuli to configured FPGAs 260. This causes configured FPGAs 260 to operate functionally and generate, in response to the applied input stimuli, digital test output traces or signals 211. Such response data are captured for performance result analysis.

Digital output vectors 12B, which are provided by EDA tool 100, are received therefrom. Digital output vectors 12B are compared with digital test output signals 211 at decision step 216 to determine a difference (or in certain cases, an identity or similarity) in signal behavior between digital output vectors 12B and digital test output signals 211.

If a difference (or similarity) is detected at decision step 216 (e.g., by detecting a "no compare" vector,) then in debug step 217, digital input vectors 12A are modified. This modification essentially causes a recordation of up to 64,000 cycles of trace vectors or stimuli, including and subsequent to a triggered read-back event. To facilitate debugging of the detected functional difference (or similarity), the execution time of the apparent circuit error ($t_{error}$) relative to applied stimuli is included in the recorded 64K time window.

In step 202, the modification includes identifying internal nodes or specifying signal net names for subsequent debug or probing, and inserting read-back trigger points or related execution break instructions within digital input vectors 12A, preferably specified to execute coincidently or prior to $t_{error}$. At step 204, debugware 280 is armed to trigger read-back, and the functionality or implemented logic of configured FPGAs 260 is re-tested operationally by applying read-back modified digital input vectors 12A to configured FPGAs 260. This event causes configured FPGAs 260 to generate modified digital test output signals 205 in the captured form of 64K data cycles, which are used in step 206 for logic analysis and debug.

Note that if no difference (or similarity) is detected at decision step 216, then functional testing and set-up is completed, and emulation may proceed at step 220. Similarly, if after logic analysis or debugging at step 206, it is determined by the design engineer that no change to the circuit netlist is necessary at decision step 218, then emulation may proceed at step 200. But if it is determined at decision step 218 that a netlist change is necessary, because of logic redesign, then such netlist 10 change is enabled by recompilation at step 219, and functional testing is repeated at step 215 using digital input vectors 12A.

Figure 7:
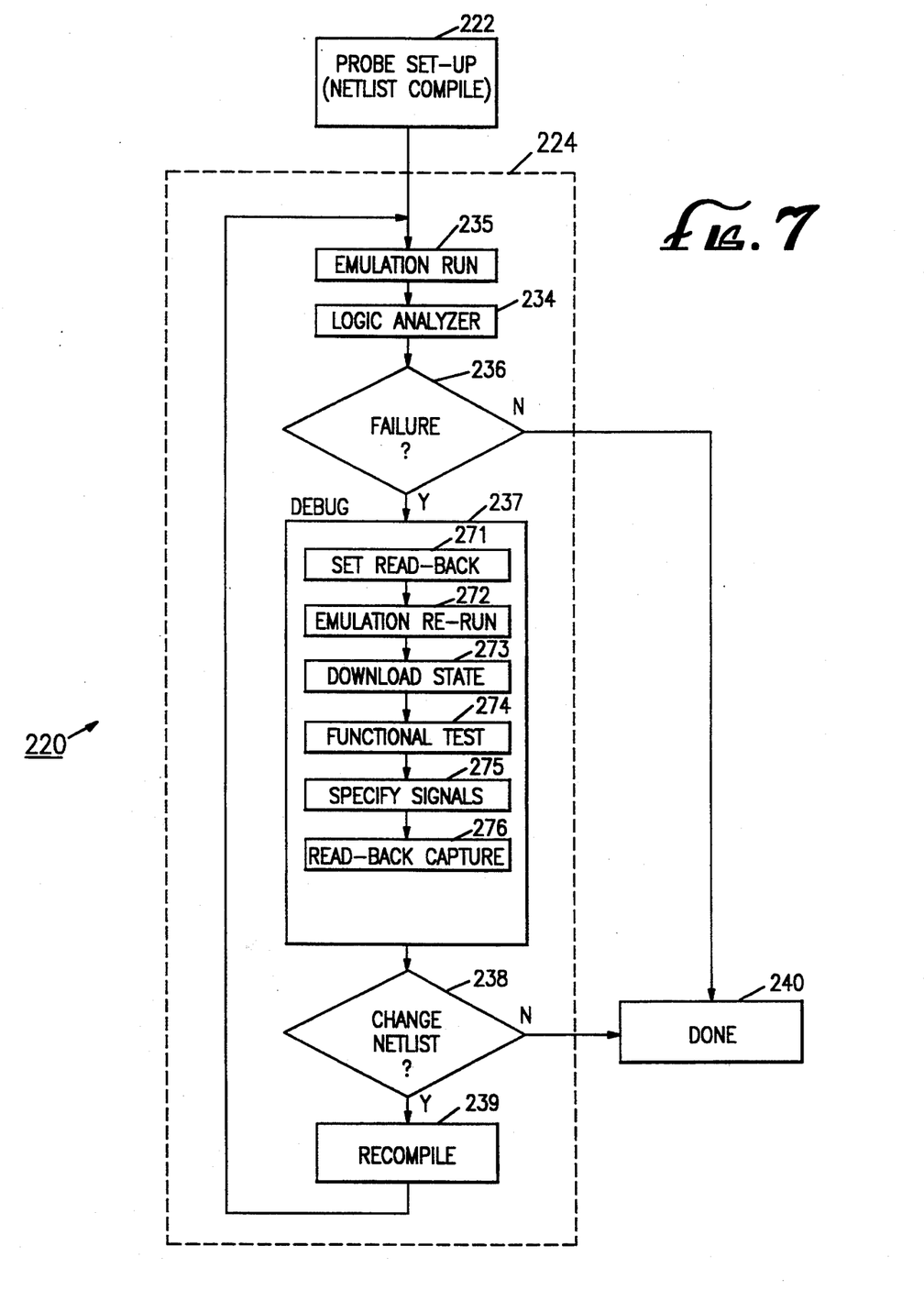
FIG. 7 is a flow chart of a method embodying the present invention in emulation test mode.

FIG. 7 shows a flow chart of a method embodying the present invention, wherein debugware 280 is set to operate in emulation mode, at step 220. It is contemplated that the functional test method of FIG. 6 and the emulation test method of FIG. 7 may be combined operationally in an extended procedure for improved EDA functionality.

Initially, at step 222, configured or netlist-compiled emulation circuits or FPGAs 260 are physically interfaced, for electrical coupling to target system 300. At step 235, target system 300 is permitted to run emulation under specified or intended real-time or "normal" operating conditions, with configured FPGAs 260 in LBMs 250 being coupled through PIA 270 to target socket 310. Emulation continues until unintended, unspecified or "abnormal" operation or actual functional error or failure of target system 300 occurs and is recognized, either by the user through the use of logic analyzer 282, or by debugware 282 by automatically identifying functional error according to pre-programmed test parameters.

By setting debugware 280 to logic analyzer mode, at step 234, trace data in the form of digital output from the emulation run may be collected, i.e., to capture the occurrence of such abnormal or functional error event at $t_{error}$. This event may also be triggered, in some cases, by a user recognition or automatic identification of output response or signal patterns associated with pre-defined abnormal or error conditions. Captured data may be shown by logic analyzer 282 on waveform display to facilitate the debug of prototype circuit 320. If, upon evaluation of such captured data, the design engineer determines that no functional failure of circuit 320 is detected, at decision step 236, then emulation is done at step 240.

However, if the design engineer determines that further circuit evaluation is necessary, then debug step 237 is initiated at step 271, where a read-back trigger instruction is inserted in the input stimuli which are applied to LBMs 250 and FPGAs 260. In this modified configuration, target system 300 is effectively armed to cause read-back trigger under an emulation re-run at step 272. Such application of a read-back trigger signal causes configured FPGAs 260 to capture a read-back state and up to 64K cycles of trace data output subsequent to the captured state.

Note that the generic operation of the read-back function by Xilinx 4000-type FPGAs 260 in response to applied trigger signal (i.e., but without any reference to circuit emulation or related debug applications) is described in commercial literature available from Xilinx.

The read-back state captured at step 272 may be down-loaded at step 273 to FPGAs 260 in LBMs 250. Debugware 280 may then be set to functional test mode to enable single-step debugging of prototype circuit 320, unlike logic analyzer (emulation) mode, during which circuit execution generally may not be readily single-stepped.

As described above, further read-back instructions may be embedded in the stimuli applied to configured FPGAs 260 during functional testing. This is accomplished by specifying, at step 275, trigger points associated with certain signal nets, which may be helpful to the design engineer in the debugging process. In this embedded read-back configuration, therefore, read-back state and 64K of subsequent trace data may be captured during functional testing.

After completing debug step 237, the design engineer determines at decision step 238 whether the present circuit 320 is satisfactory; if so, emulation is done at step 240. Otherwise, the netlist 10 of prototype circuit 320 is changed appropriately at step 239, and steps 235 et al. are repeated.

Figure 8:
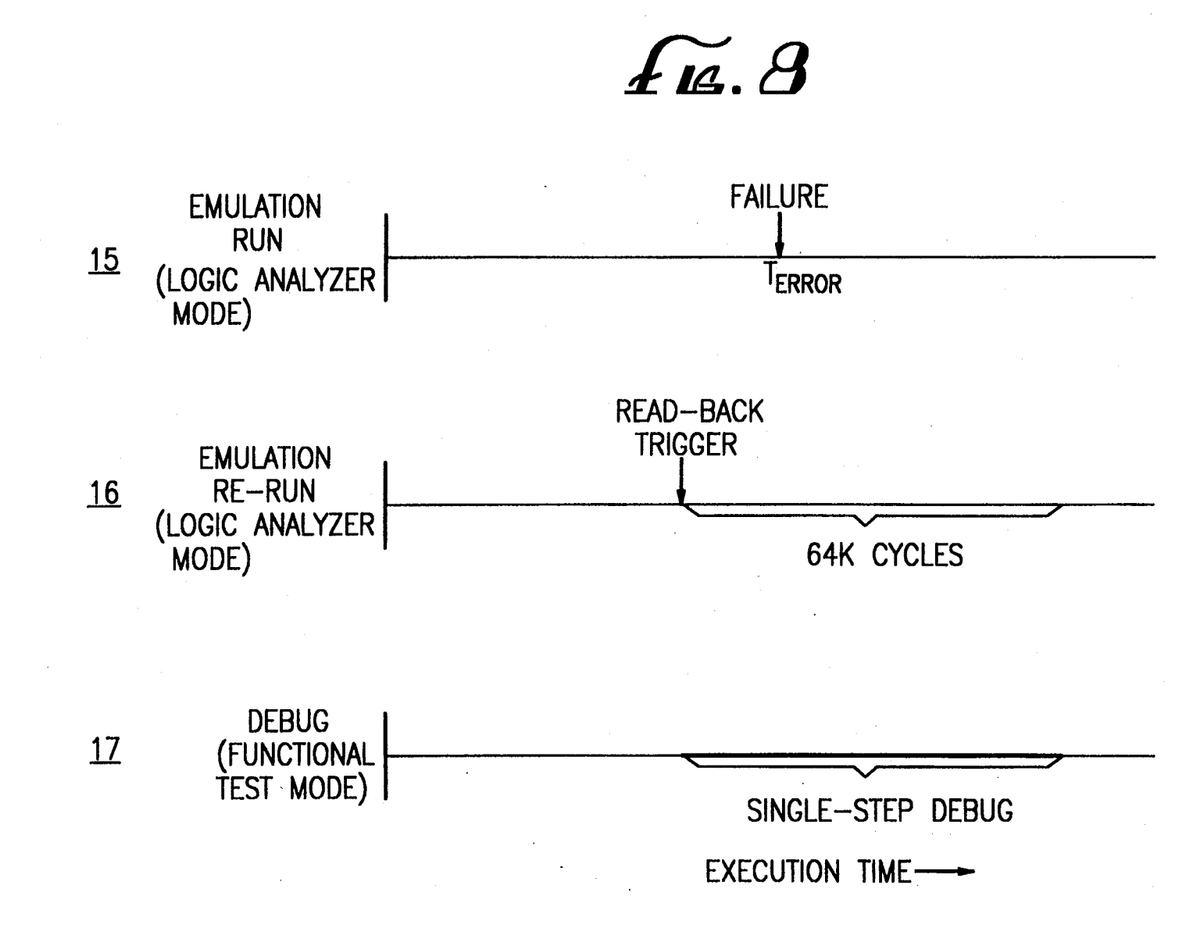
FIG. 8 is a set of timing diagrams displaying emulation runs 15, 16 in logic analyzer mode, and circuit debugging in functional test mode.

In summary, FIG. 8 is provided to illustrate, using a set of corresponding timing diagrams, an emulation debug session representative of the present invention. Initially, during timing diagram 15, a design engineer performs an emulation run 235 using the present system configured in logic analyzer mode. At time $t_{error}$, a circuit abnormality or functional failure is detected during emulation execution. Next, during timing diagram 16, emulation re-run 272 is performed, again in logic analyzer mode. In accordance with the present invention, a read-back trigger signal is applied to configured FPGAs 260 during emulation re-run. This modification of the applied stimuli causes a read-back state and corresponding 64K trace data window to be captured, preferably about $t_{error}$.

Finally, during timing diagram 17, single-step debug of prototype circuit 320 may be accomplished using functional tester 281. Optionally, read-back data capture is applied during such functional test mode.

We claim:

1. A method for testing a reconfigurable emulation system to ensure that it accurately implements a netlist description of a functional circuit, the method comprising the steps of:
   configuring the reconfigurable emulation system to implement the functional circuit;
   applying stimuli to the functional circuit implemented in the reconfigurable emulation system, thereby causing the functional circuit implemented in the reconfigurable emulation system to generate an actual response, said stimuli applied in a first emulation cycle;
   detecting when said actual response differs from an expected response during said first emulation cycle;
   if the actual response differs from the expected response, specifying a particular net where an apparent error is located in the netlist description and the time within said first emulation cycle when said apparent error occurred; and
   modifying said stimuli applied to the functional circuit implemented in the reconfigurable emulation system to include a read-back signal which, during a subsequent emulation cycle, is applied to said particular net where said apparent error is located at a time corresponding to said time of said apparent error, said read-back signal causing the reconfigurable emulation system to output state information of the reconfigurable emulation system at said particular net where said apparent error is located at said time of said apparent error.

2. The method of claim 1 further comprising the step of examining said state information to determine whether said apparent error was caused by an improper implementation of the netlist description in the reconfigurable emulation system or by an error in the netlist description.

3. The method of claim 2 wherein if said apparent error was caused by an error in the netlist description, the method further comprises the step of correcting the netlist description to eliminate said apparent error.

4. The method of claim 1 wherein the reconfigurable emulation system includes at least one field programmable gate array, wherein said at least one FPGA can be triggered to read back the state of flip-flops and latches employed therein.

5. The method of claim 1 wherein the stimuli comprises data and clock signals.

6. The method of claim 1 wherein the stimuli comprises a plurality of digital input vector signals including both data and clock signals.

7. The method of claim 1 wherein the state information comprise latch and flip-flop states internal to the reconfigurable emulation system which are shifted-out serially from the reconfigurable emulation system to at least one external port coupled thereto.

8. The method of claim 1 wherein the modified stimulus a modified clock signal.

9. The method of claim 2 further comprising reconfiguring the reconfigurable emulation system to implement said corrected netlist description.

10. A method for functionally testing a circuit undergoing logic emulation comprising the steps of:
    configuring a plurality of reprogrammable logic devices with a netlist description of an integrated circuit;
    applying digital input vectors to said configured reprogrammable logic devices to cause said configured reprogrammable logic devices to generate digital output signals;
    comparing said digital output vectors with said digital output signals to determine a difference between said digital output vectors and said digital output signals;
    if said difference is detected, modifying said digital input vectors to include read-back trigger point information within the digital input vectors, said read-back trigger point information comprising a particular net within the netlist description and a time at which said difference occurred;
    applying the modified digital input vectors to the configured reprogrammable logic devices to cause the configured reprogrammable logic devices to generate modified digital output signals, said modified digital output signals including state information from registers where said particular net is implemented within said reprogrammable logic devices at said time at which said difference occurred;
    examining said state information to determine whether said difference was caused by an error in said netlist; and
    if said difference was caused by an error in said netlist, correcting said netlist so that said difference will not occur.

11. A method of debugging a prototype integrated circuit design prior to fabricating the prototype integrated circuit design comprising:
    mapping a netlist description of the integrated circuit design into a reconfigurable emulation system, thereby creating an emulated integrated circuit;
    operating said emulated integrated circuit in a target system by running actual input stimuli through said target system, said target system comprising a system where the fabricated version of the prototype integrated circuit design will reside, thereby running the prototype integrated circuit under real-time operating conditions;
    if said target system fails during said operating step, specifying a particular net within the netlist description where an apparent error is located and a point in time during said operating step where said apparent error took place;
    modifying said input stimuli applied to said target system such that said modified input stimuli will induce said reconfigurable emulation system to capture state information of memory elements within said reconfigurable emulation system where said particular net is mapped at said point in time where said apparent error took place;
    re-operating said emulated integrated circuit with said modified input stimuli;
    examining said state information to determine how to correct the netlist description to eliminate said apparent error; and
    correcting the netlist description to eliminate said apparent error.

* * * * *